(12) United States Patent
Matsumoto et al.

(10) Patent No.: US 8,753,475 B2
(45) Date of Patent: *Jun. 17, 2014

(54) PLASMA PROCESSING APPARATUS

(75) Inventors: Naoki Matsumoto, Hyogo (JP); Jun Yoshikawa, Hyogo (JP); Masaru Sasaki, Hyogo (JP); Kazuyuki Kato, Hyogo (JP); Masafumi Shikata, Hyogo (JP); Shingo Takahashi, Hyogo (JP)

(73) Assignee: Tokyo Electron Limited, Tokyo (JP)

( * ) Notice: Subject to any disclaimer, the term of this patent is extended or adjusted under 35 U.S.C. 154(b) by 270 days.

This patent is subject to a terminal disclaimer.

(21) Appl. No.: 12/366,907

(22) Filed: Feb. 6, 2009

(65) Prior Publication Data
US 2009/0211708 A1    Aug. 27, 2009

(30) Foreign Application Priority Data

| Feb. 8, 2008 | (JP) | ................................. 2008-029177 |
| Feb. 27, 2008 | (JP) | ................................. 2008-045697 |
| Feb. 6, 2009 | (JP) | ................................. 2009-026422 |
| Feb. 6, 2009 | (JP) | ................................. 2009-026423 |

(51) Int. Cl.
*C23C 16/00* (2006.01)
*C23F 1/00* (2006.01)
*H01L 21/306* (2006.01)

(52) U.S. Cl.
USPC .............................. 156/345.41; 118/723 MW

(58) Field of Classification Search
USPC ........ 118/723 R, 723 MW, 723 ME, 723 MR; 156/345.41, 345.42
See application file for complete search history.

(56) References Cited

U.S. PATENT DOCUMENTS

| 6,818,852 | B2 * | 11/2004 | Ohmi et al. | ............... 219/121.43 |
| 7,469,654 | B2 * | 12/2008 | Ishibashi et al. | ...... 118/723 MW |
| 2003/0173030 | A1 * | 9/2003 | Ishii et al. | ................ 156/345.48 |
| 2007/0113788 | A1 * | 5/2007 | Nozawa et al. | ....... 118/723 MW |

FOREIGN PATENT DOCUMENTS

| CN | 1846300 A | 10/2006 | |
| JP | 2001-077624 A | 3/2001 | |
| JP | 2003-059919 | * 2/2003 | .............. H01L 21/31 |
| JP | 2003-168681 A | 6/2003 | |
| JP | 2004-014262 A | 1/2004 | |
| JP | 2005-100931 | * 4/2005 | .............. H05H 1/46 |
| JP | 2005-100931 A | 4/2005 | |
| JP | 2005100931 A | 4/2005 | |
| JP | 2005-353364 A | 12/2005 | |
| KR | 10-2002-0088413 A | 11/2002 | |
| WO | WO 03/105544 | * 12/2003 | .......... H01L 21/3065 |

OTHER PUBLICATIONS

Korean Office action for 10-2009-0009977 dated Oct. 19, 2010.

* cited by examiner

*Primary Examiner* — Rakesh Dhingra
(74) *Attorney, Agent, or Firm* — Pearne & Gordon LLP

(57) ABSTRACT

Provided is a plasma processing apparatus featuring highly improved plasma ignition property and ignition stability by defining a positional relationship between a dielectric and the slots. A plasma processing apparatus 11 includes a processing chamber 12 having a top opening; a dielectric 15 which has inclined surfaces 16a and 16b on a bottom surface thereof so that a thickness dimension is successively varied, and is disposed so as to close the top opening of the processing chamber 12; and an antenna 24 disposed on a top surface of the dielectric 15, for supplying microwave to the dielectric 15, thereby generating plasma at the bottom surface of the dielectric 15. Further, the antenna 24 is provided with a plurality of slots 25 positioned uprightly above the inclined surfaces 16a and 16b.

6 Claims, 12 Drawing Sheets

PLASMA PROCESSING APPARATUS

FIELD OF THE INVENTION

The present disclosure relates to a plasma processing apparatus.

BACKGROUND OF THE INVENTION

A conventional plasma processing apparatus is disclosed in, for example, Japanese Patent Laid-open Publication No. 2005-100931 (Patent Document 1). The plasma processing apparatus described therein includes: a plasma generating chamber which accommodates a target substrate therein; an antenna which generates an electromagnetic field driven by microwave; a top plate which seals an opening portion of the plasma generating chamber; and a tapered protruding portion or recess portion formed at a bottom surface side of the top plate.

The plasma processing apparatus having the above-described configuration is capable of forming an optimal resonance region under any conditions by successively varying the thickness of the top plate in a diametric direction. As a result, it is mentioned in Patent Document 1 that a stable plasma generation is enabled.

Patent Document 1: Japanese Patent Laid-open Publication No. 2005-100931

BRIEF SUMMARY OF THE INVENTION

In the plasma processing apparatus having the above-described configuration, the microwave is radiated toward the top plate from slots provided in the antenna. Accordingly, a positional relationship between the top plate and the slots is deemed to be important to realize a stable plasma generation.

In view of the foregoing, the present disclosure provides a plasma processing apparatus featuring highly improved plasma ignition property and ignition stability by defining a positional relationship between a dielectric and the slots.

A material for constituting the top plate having the above-described configuration can be ceramics or the like in addition to quartz. Here, since the microwave resonance region depends on the material of the top plate, it is desirable to define the shape of the top plate depending on its material in order to stably generate the plasma.

Here, the present disclosure also provides a plasma processing apparatus having further improved plasma ignition property by defining an optimal shape of the top plate depending on the material thereof.

A plasma processing apparatus in accordance with an embodiment of the present invention includes: a processing chamber having a top opening; a dielectric which has inclined surfaces on a bottom surface thereof so that a thickness dimension is successively varied, and is disposed so as to close the top opening of the processing chamber; and an antenna disposed on a top surface of the dielectric, for supplying microwave to the dielectric, thereby generating plasma at the bottom surface of the dielectric. Further, the antenna is provided with a plurality of slots positioned uprightly above the inclined surfaces.

With the above-described configuration, the microwave is radiated onto the inclined surfaces through the slots. If the frequency of the microwave becomes coincident with the thickness dimension of the dielectric plate at any one position of the inclined surfaces, the electric field intensity at the bottom surface of the dielectric increases. Thus, plasma ignition property and stability improves.

Desirably, a ring-shaped groove is formed in the bottom surface of the dielectric, and the inclined surfaces serve as an inner peripheral sidewall surface and an outer peripheral sidewall surface of the ring-shaped groove. Further, the slots are positioned uprightly above each of the inner peripheral sidewall surface and the outer peripheral sidewall surface. As an example, the inclined surfaces are conic surfaces.

Desirably, the plurality of slots is inclined in a same direction at a same angle relative to straight lines connecting the center of the antenna with each slot. As a result, etching rate (E/R) distribution becomes uniform.

A plasma processing apparatus in accordance with an embodiment of the present invention includes: a processing chamber having a top opening; a dielectric which has a ring-shaped groove on a bottom surface thereof, and is disposed so as to close the top opening of the processing chamber; and an antenna for supplying microwave to the dielectric, thereby generating plasma at the bottom surface of the dielectric. Further, if velocity of light, frequency of the microwave and dielectric constant of a material constituting the dielectric are c, f and $\epsilon r$, respectively, a groove width w of the groove satisfies Equation 1 as follows.

$$\frac{c}{f\sqrt{\varepsilon r}} \times 0.5 \leq w \leq \frac{c}{f\sqrt{\varepsilon r}} \times 1.5 \qquad [\text{Equation 1}]$$

With the above-described configuration, the microwave is allowed to resonate in the width direction of the groove, so that the electric field intensity at the entire bottom surface of the dielectric enhances. Thus, the plasma processing apparatus having highly advantageous plasma ignition property can be obtained.

Desirably, if a radius of the dielectric is R, the groove is located outside a position corresponding to R/4 from the center of the dielectric. As a result, plasma is ignited from an outer peripheral portion of the dielectric (edge first).

As an example, if the frequency of the microwave supplied from the antenna is $f=2.45\times10^9$ (Hz) and the material constituting the dielectric is quartz having a dielectric constant of $\epsilon r=3.8$, the groove width w of the groove satisfies 33 mm≤w≤93 mm.

Desirably, at least one of an inner peripheral sidewall surface and an outer peripheral sidewall surface of the groove is an inclined surface which is inclined so that a thickness dimension of the dielectric is successively varied. More desirably, the antenna is provided with a plurality of slots penetrating in a thickness direction thereof. Further, the plurality of slots is positioned uprightly above the inclined surface. Accordingly, the microwave is radiated onto the inclined surfaces through the slots. If the frequency of the microwave becomes coincident with the thickness dimension of the dielectric plate at any one position of the inclined surfaces, electric field intensity at the bottom surface of the dielectric increases. Thus, plasma ignition property and ignition stability improves.

Desirably, the plurality of slots is inclined in a same direction at a same angle relative to straight lines connecting the center of the antenna with each slot. Accordingly, E/R distribution becomes uniform.

In accordance with the present disclosure, by arranging the slots uprightly above the inclined surfaces, a plasma processing apparatus having further improved plasma ignition property and stability can be obtained.

Further, in accordance with the present disclosure, by defining the width of the groove based on the dielectric constant of the dielectric, a plasma processing apparatus having further improved plasma ignition property can be acquired.

BRIEF DESCRIPTION OF THE DRAWINGS

The disclosure may best be understood by reference to the following description taken in conjunction with the following figures.

DETAILED DESCRIPTION OF THE INVENTION

Figure 1:
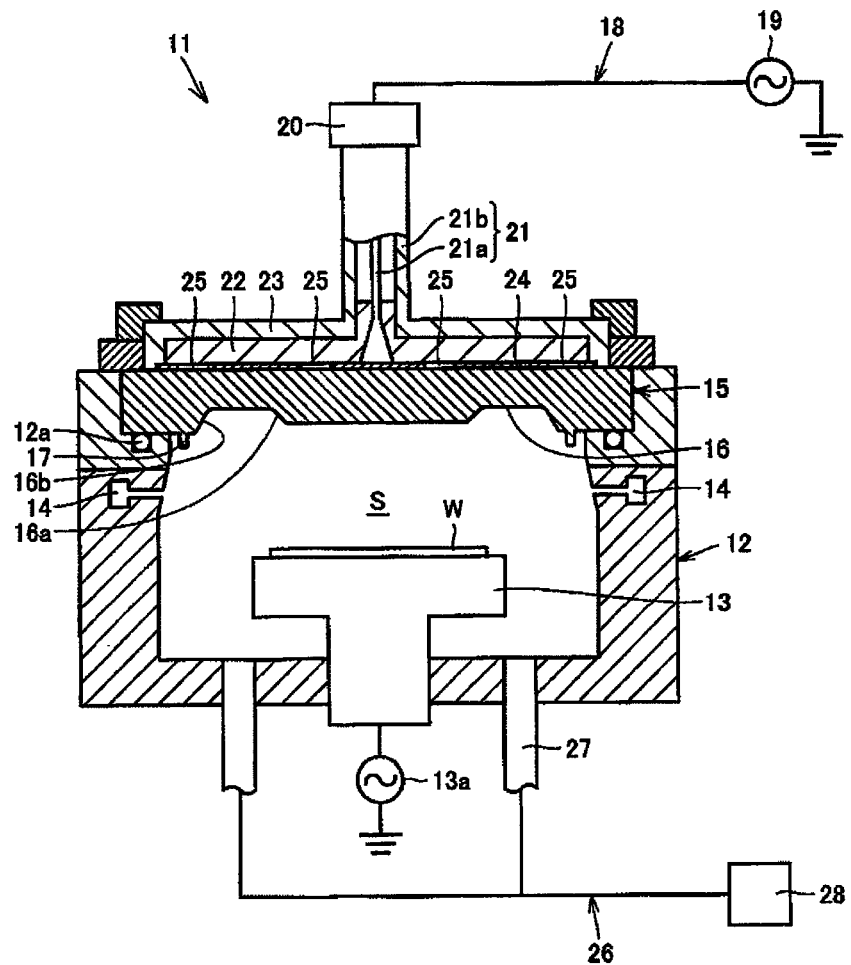
FIG. 1 is a cross sectional view of a plasma processing apparatus in accordance with an embodiment of the present invention.
Figure 2:
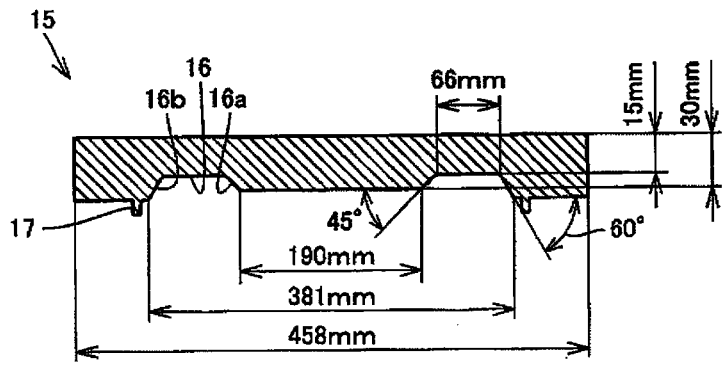
FIG. 2 is a cross sectional view of a dielectric shown in FIG. 1.
Figure 3:
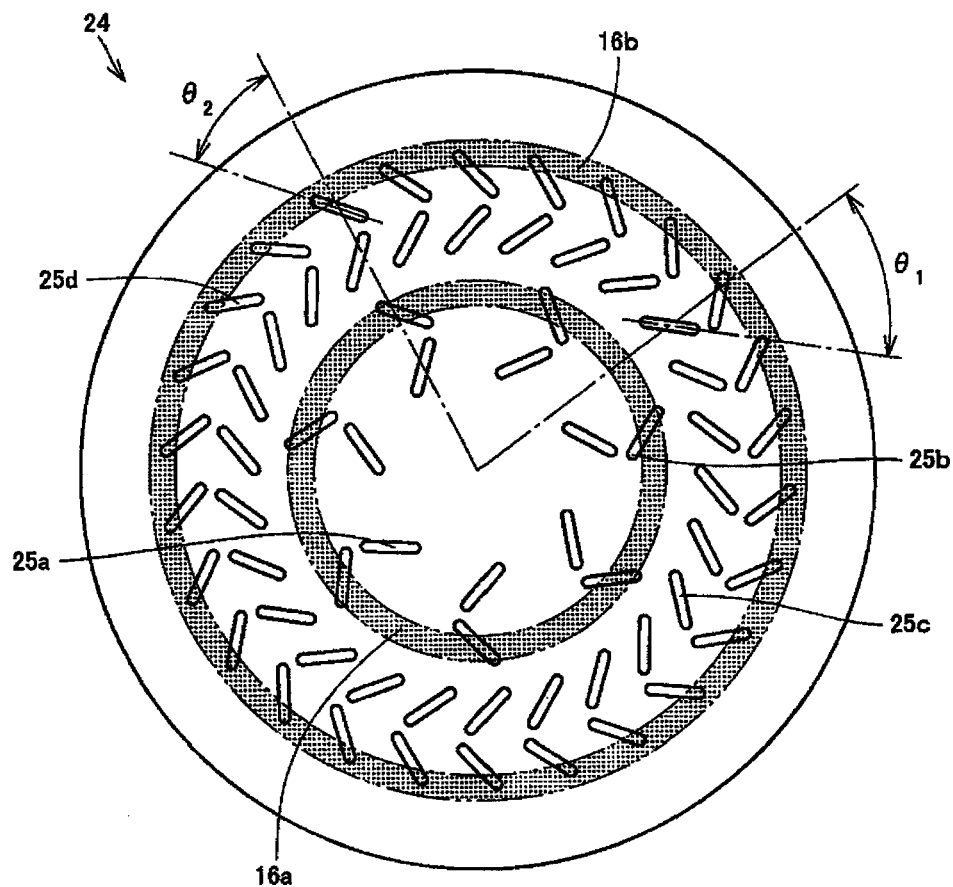
FIG. 3 is a plan view illustrating a slot antenna overlapped with the dielectric shown in FIG. 1.

Hereinafter, a plasma processing apparatus 11 in accordance with an embodiment of the present invention will be described with reference to FIGS. 1 to 3. FIG. 1 illustrates the plasma processing apparatus 11; FIG. 2 sets forth a cross sectional view of a dielectric 15; and FIG. 3 presents a plan view showing a slot antenna 24 and the dielectric 15 overlapped with each other. First, referring to FIG. 1, the plasma processing apparatus 11 includes: a processing chamber 12 forming a plasma processing space S; the dielectric 15; a microwave supply unit 18; and a gas exhaust unit 26.

The processing chamber 12 is a cylindrical body having a top opening and a bottom. The processing chamber 12 includes therein: a susceptor 13 serving as a holding table for holding a semiconductor wafer W thereon; and a gas inlet 14 for introducing a processing gas. The susceptor 13 carries out a control of a surface temperature of the semiconductor wafer W, and is connected with an AC power supply 13a for generating a high frequency bias signal. The gas inlet 14 is provided in the sidewall surface of the processing chamber 12 so as to supply the processing gas from a processing gas supply source (not shown) into the processing space S. An Ar gas, a $C_4F_8$ gas, or the like is used as the processing gas depending on a process involved.

The dielectric 15 is a disc-shaped member made of quartz and is disposed to close the top opening of the processing chamber 12. Further, a seal member 12a for hermetically sealing the processing space S is installed on a contact surface between the processing chamber 12 and the dielectric 15.

Now, the configuration of the dielectric 15 will be described in detail with reference to FIG. 2. On the bottom surface of the dielectric 15, there is provided a ring-shaped groove 16 and a skirt 17 for protecting the processing chamber 12 from plasma.

Sidewall surfaces 16a and 16b of the groove 16 are formed as inclined surfaces which are inclined so that the thickness dimension of the dielectric 15 is successively varied. In the present embodiment, each of the inner peripheral sidewall surface 16a and the outer peripheral sidewall surface 16b has conic surface (sidewall surface of a cone) shape, that is, sectional shape thereof is a straight line. However, it is not limited thereto, but may have curved sectional shape (e.g., an inclined portion 34c of FIG. 23).

Further, assuming that a region within R/4 from the center of the dielectric 15 (R denotes a radius of the dielectric 15) is defined as a central region and a region outside the central region is defined as an edge region, the groove 16 is provided in the edge region of the dielectric 15. That is, the inner diameter of the groove 16 is larger than R/4.

Further, in the present embodiment, the diameter of the dielectric 15 is set to be about 458 mm; the inner diameter of the groove 16, about 190 mm; the outer diameter of the groove 16, about 381 mm; the groove width w (width of the bottom wall) of the groove 16, about 66 mm; the thickness of the dielectric 15 in the central region, about 30 mm; the thickness of the dielectric 15 at the bottom wall of the groove 16, about 15 mm; and the angle between the bottom surface of the central region and the inner peripheral sidewall surface 16a is set to be about 45 degrees, while the angle between the bottom surface of the central region and the outer peripheral sidewall surface 16b is set to be about 60 degrees.

Here, a theoretical value $w_0$ of the groove width (width of the bottom wall) of the groove 16 is calculated from the following Equation 1, wherein c, f and εr denote the velocity of light, the frequency of microwave, and the dielectric constant of the material constituting the dielectric, respectively.

$$\omega_0 = \frac{c}{f\sqrt{\varepsilon r}} \quad \text{[Equation 1]}$$

In the present embodiment, since the velocity c of light is $2.99792458\times10^{11}$ (mm/s); the frequency f of microwave is $2.45\times10^9$ (Hz); and the dielectric constant $\varepsilon r$ of quartz constituting the dielectric 15 is 3.8, $w_0$ becomes approximately 63 mm.

Further, a margin of about ±50% of the theoretical value $w_0$ is allowed for the actual groove width w, the groove width w can be set within a range satisfying Equation 2, that is, a range of about 33 mm≤w≤93 mm in this embodiment.

$$\frac{c}{f\sqrt{\varepsilon r}}\times 0.5 \le w \le \frac{c}{f\sqrt{\varepsilon r}}\times 1.5 \quad \text{[Equation 2]}$$

Furthermore, though the above embodiment has been described for the example of employing quartz as the material constituting the dielectric 15, it is not limited thereto, but it may also be possible to use ceramics (having a dielectric constant of about 9.5 to 9.6) such as AlN, for instance. In such case, the groove width w of the groove 16 ranges from about 20 mm≤w≤60 mm.

The microwave supply unit 18 is a device for supplying the microwave to the dielectric 15 to generate plasma on the bottom surface of the dielectric 15, and it includes: a microwave generating source 19 for generating the microwave of a preset frequency f; a load matching box 20; a coaxial waveguide 21; a wavelength shortening plate 22; an antenna cover 23 covering the wavelength shortening plate 22; and the slot antenna 24.

The coaxial waveguide 21 includes an inner conductor 21a and an outer pipe 21b surrounding the inner conductor 21a. One end portion of the inner conductor 21a is connected with the microwave generating source 19 via the load matching box 20, while the other end portion thereof is connected with the slot antenna 24, so that the microwave generated from the microwave generating source 19 is supplied to the slot antenna 24. Further, the shape of the other end portion (the slot antenna 24 side) of the inner conductor 21a has a cone shape enlarged toward the slot antenna 24, whereby the microwave can be efficiently propagated to the slot antenna 24.

The slot antenna 24 is a thin circular plate made of copper coated with a conductive material such as Ag, Au, or the like, and is disposed on the top surface of the dielectric 15. Further, the slot antenna 24 is provided with a plurality of slots 25 having elongated hole shapes penetrating in its thickness direction. The microwave generated from the microwave generating source 19 is radiated to the dielectric 15 through the slots 25.

Referring to FIG. 3, if the dielectric 15 and the slot antenna 24 are overlapped with each other, at least some parts of the slots 25 are located uprightly above the inner peripheral sidewall surface 16a and outer peripheral sidewall surface 16b, which are inclined surfaces. In the present embodiment, the slots 25 are divided into a first slot group 25a located uprightly above the central region; a second slot group 25b located uprightly above the inner peripheral sidewall surface 16a; a third slot group 25c located uprightly above the bottom wall of the groove 16; and a fourth slot group 25d located uprightly above the outer peripheral sidewall surface 16b.

Further, as for the layout of the slots 25, slots (the first and third slot groups 25a and 25c), which are inclined in one direction (clockwise direction) at the same angle $\theta_1$ relative to straight lines connecting the center of the slot antenna 24 with each slot 25, and slots (the second and fourth slot groups 25b and 25d), which are inclined at the same angle $\theta_2$ in the opposite direction (counterclockwise direction), are arranged alternately in a diametrical direction (such arrangement is referred to as a "radial line slot").

The gas exhaust unit 26 is a device for exhausting a processing gas in the processing space S to the exterior, and includes: a gas exhaust pipe 27 connected with the processing chamber 12; and a vacuum pump 28 for exhausting the processing gas from the inside of the processing space S via the gas exhaust pipe 27.

Now, the operation of the plasma processing apparatus 11 having the above-described configuration will be explained.

First, the semiconductor wafer W is mounted on the susceptor 13. During a plasma process, the surface temperature of the semiconductor wafer W is controlled by the susceptor 13, and a high frequency bias is applied to the semiconductor wafer W from the AC power supply 13a.

Subsequently, the processing gas is supplied into the processing space S from the gas inlet 14, and a residual processing gas is exhausted by the gas exhaust unit 26. Accordingly, the inside of the processing space S can be maintained at a specific pressure level.

Then, as the microwave generated from the microwave generating source 19 is propagated to the dielectric 15 via the load matching box 20, the coaxial waveguide 21, the wavelength shortening plate 22 and the slot antenna 24, an electric field is generated at the bottom surface of the dielectric 15. As a result, the processing gas in the processing space S is ionized and excited into plasma. By selecting the kind of the processing gas, various plasma processes such as an etching process, an ashing process, a film forming process or the like can be performed on the semiconductor wafer W.

Figure 4:
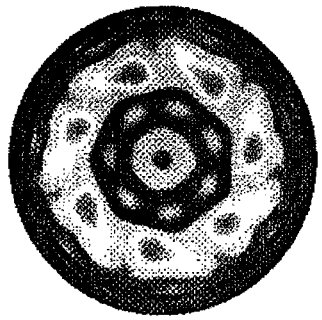
FIG. 4 shows an electric field intensity of the dielectric shown in FIG. 2.
Figure 5:
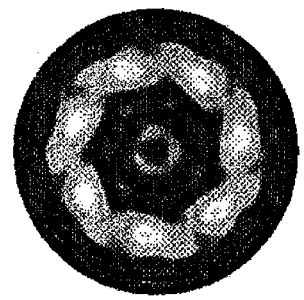
FIG. 5 shows an electric field intensity in case that a groove width is set to be about 71 mm.
Figure 6:
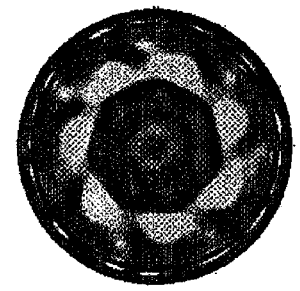
FIG. 6 shows an electric field intensity in case that a groove width is set to be about 61 mm.
Figure 7:
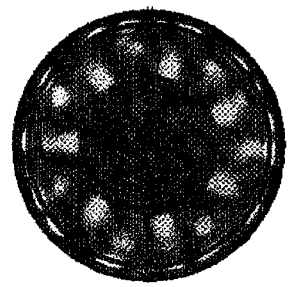
FIG. 7 shows an electric field intensity in case that a groove width is set to be about 56 mm.
Figure 8:
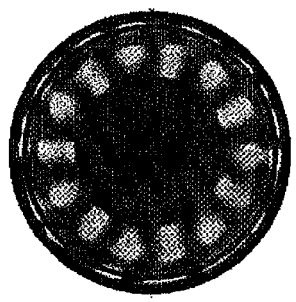
FIG. 8 shows an electric field intensity in case that a groove width is set to be about 51 mm.
Figure 9:
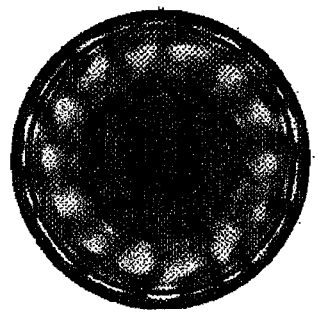
FIG. 9 shows an electric field intensity in case that a groove width is set to be about 46 mm.
Figure 10:
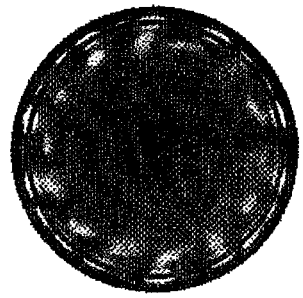
FIG. 10 shows an electric field intensity in case that a groove width is set to be about 41 mm.
Figure 11:
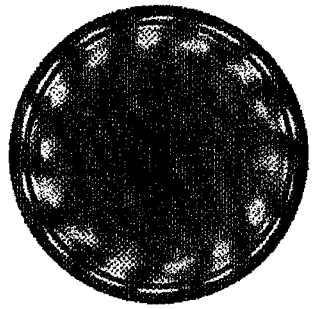
FIG. 11 shows an electric field intensity in case that a groove width is set to be about 36 mm.
Figure 12:
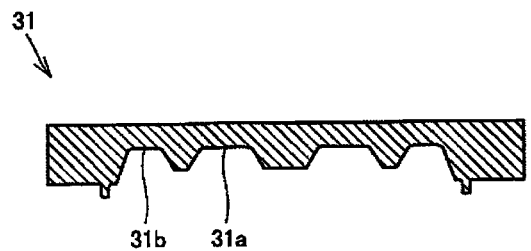
FIG. 12 is a cross sectional view of a dielectric of a comparative example 1.
Figure 13:
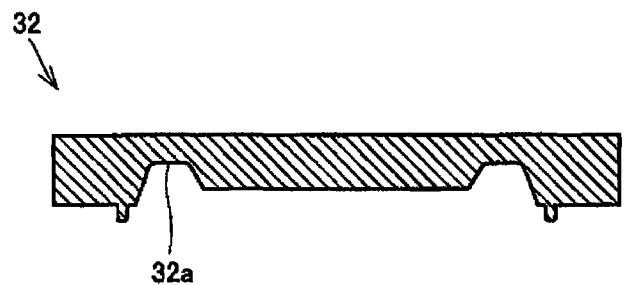
FIG. 13 is a cross sectional view of a dielectric of a comparative example 2.
Figure 14:
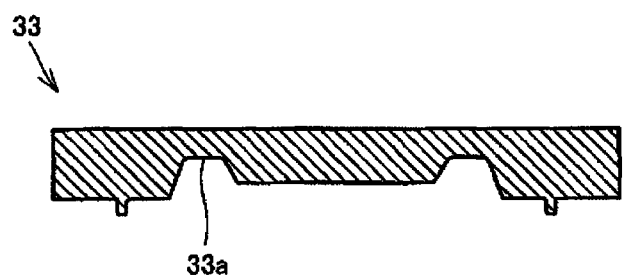
FIG. 14 is a cross sectional view of a dielectric of a comparative example 3.

Now, referring to FIGS. 4 to 11, the variation of electric field intensity in relation with the variation of the groove width w of the groove 16 will be explained. FIG. 4 is a diagram showing electric field intensity in the embodiment shown in FIG. 2 in which the groove width w is set to be about 66 mm. FIGS. 5 to 11 provide diagrams showing electric field intensity in each of cases where the groove width w is set to be about 71 mm (FIG. 5), 61 mm (FIG. 6), 56 mm (FIG. 7), 51 mm (FIG. 8), 46 mm (FIG. 9), 41 mm (FIG. 10), and 36 mm (FIG. 11), respectively. Furthermore, in each of FIGS. 4 to 11, as the electric field intensity increases, the color gets brighter (lighter), while it gets darker (deeper) as the electric field intensity decreases.

Referring to FIGS. 4 to 11, it was found that the electric field intensity was equal to or greater than a preset value in all dielectrics 15. Further, it was also found that the dielectric 15 having the groove width w of about 66 mm (FIG. 4) has the highest electric field intensity, while the electric field intensity decreases as the groove width w of the groove 16 increases or decreases from about 66 mm.

That is, by defining the groove width w within the range of Equation 2, i.e., within the range of about 33 mm≤w≤93 mm in the present embodiment, the microwave is allowed to resonate in the width direction of the groove 16, resulting in the enhancement of the electric field intensity at the bottom surface of the dielectric 15. As a result, the plasma ignition property necessary for the process can be obtained.

In particular, in the dielectrics 15 having the groove widths of about 66 mm (FIG. 4), 71 mm (FIG. 5) and 61 mm (FIG. 6), there were observed portions having especially high electric field intensity at certain intervals. That is, by defining the groove width w of the dielectric 15 to be within the range of about ±5 mm (±7.5%) from the groove width of about 66 mm, the plasma ignition property of the plasma processing apparatus 11 can be greatly improved even in case that the inside of the processing space S is under a low pressure (e.g., about 50 mT or less).

Meanwhile, in each dielectric 15 having the groove width equal to or less than about 56 mm, the electric field intensity was found not to be so high even at the position of the groove 16. In case of using these dielectrics 15, it is deemed that the plasma ignition property would be deteriorated under the low-pressure environment though it may still be possible to ignite the plasma sufficiently by way of setting the inside of the processing space S to be under a high pressure (e.g., about 100 mT or higher).

Further, though there can be made an attempt to increase the groove width w over 71 mm in consideration of resonating the microwave, the upper limit of the groove width w is also restricted according to the diameter of the dielectric 15. That is, if the groove width w becomes excessively large relative to the diameter of the dielectric 15, a problem such as the reduction of the strength of the dielectric 15 or the like is likely to arise.

Further, in all cases (FIGS. 4 to 11), it was found that the electric field intensity is high at the position of the groove 16, and as the position gets further away from the groove 16, the electric field intensity decreases. Thus, it is possible to control a plasma ignition start point based on the position of the groove 16. Specifically, if the groove 16 is provided in the central region of the dielectric 15, the plasma ignition takes place from the central region (center first). Meanwhile, if the groove 16 is provided in the edge region of the dielectric 15, the plasma ignition starts from the edge region (edge first).

Now, the variation of plasma uniformity according to the variation of the position or size of the groove 16 will be explained with reference to FIG. 2 and FIGS. 12 to 22. FIG. 2 and FIGS. 12 to 14 are diagrams illustrating shapes of dielectrics (comparative examples 1 to 3); FIGS. 15 to 18 are graphs showing distributions of the electron number Ne when using each dielectric; and FIGS. 19 to 22 are graphs showing distributions of etching rate (E/R) when using each dielectric.

First, the experimental example 1 provides the dielectric 15 shown in FIG. 2. A dielectric 31 of the comparative example 1 (FIG. 12) includes an inner peripheral groove 31a provided in a central region and an outer peripheral groove 31b provided in an edge region. A dielectric 32 of the comparative example 2 (FIG. 13) is provided with a groove 32a, which has a groove width narrower than that of the groove 16 and is positioned outwardly (its outer diameter coincides with that of the groove 16). A dielectric 33 of the comparative example 3 (FIG. 14) is provided with a groove 33a, which has a groove width narrower that that of the groove 16 and is positioned inwardly (its inner diameter coincides with that of the groove 16). Further, the inner peripheral groove of the comparative example 1 is not included in the scope of the groove of the present disclosure.

Figure 15:
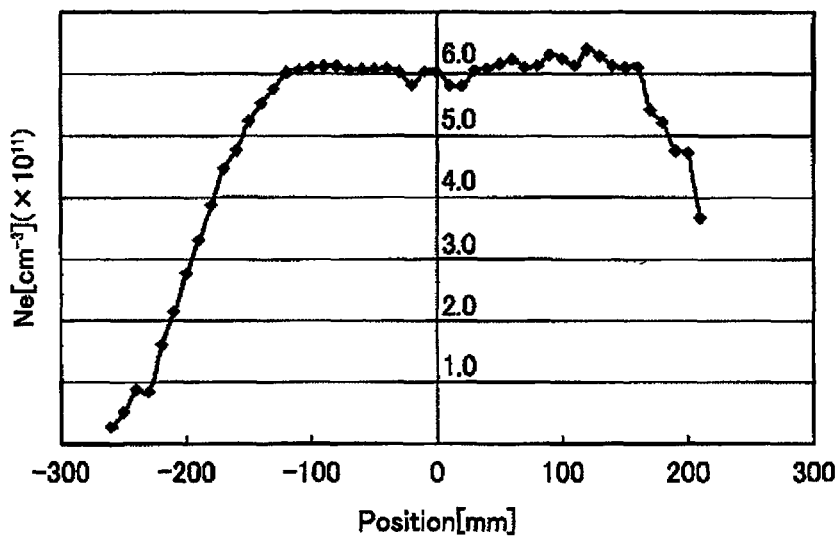
FIG. 15 is a graph showing an electron number distribution of an experimental example 1.
Figure 16:
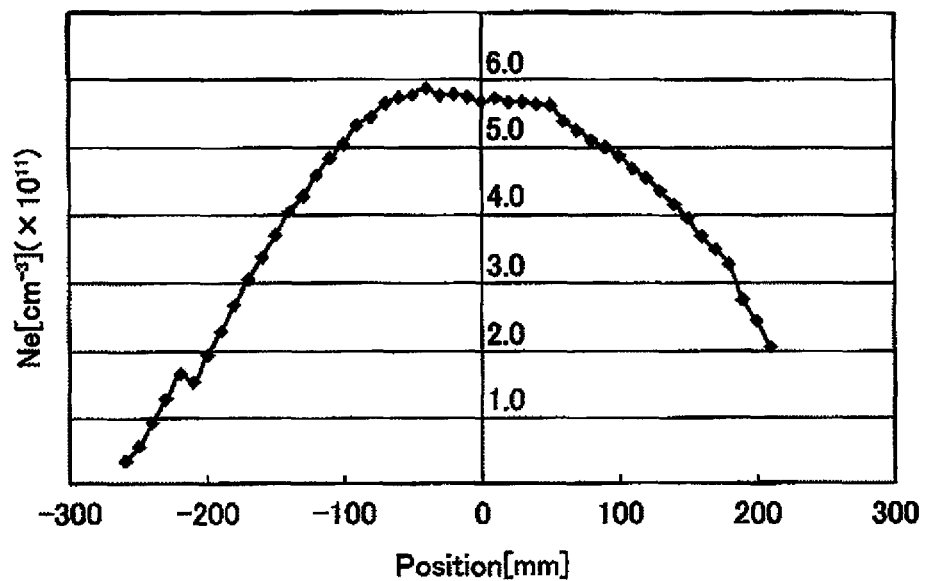
FIG. 16 is a graph showing an electric number distribution of the comparative example 1.
Figure 17:
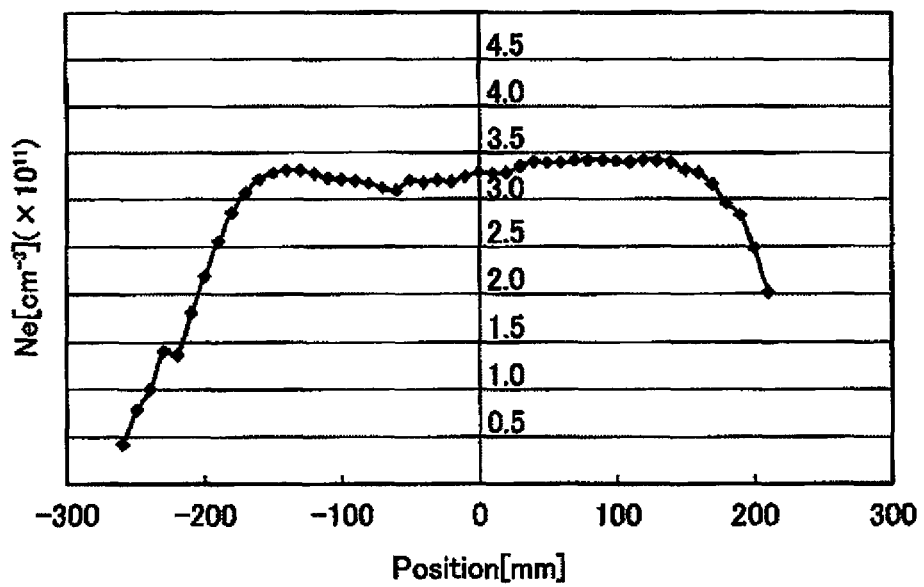
FIG. 17 is a graph showing an electric number distribution of the comparative example 2.

Referring to FIGS. 15 to 18, in all the dielectrics, the electron number Ne tends to be great in the central region while it decreases as it goes toward the edge region. Especially, in the comparative example 1, a big difference in the electron number Ne between the central region and the edge region was observed (FIG. 16). Accordingly, it is desirable to install the groove only in the edge region, and not in the central region.

Figure 18:
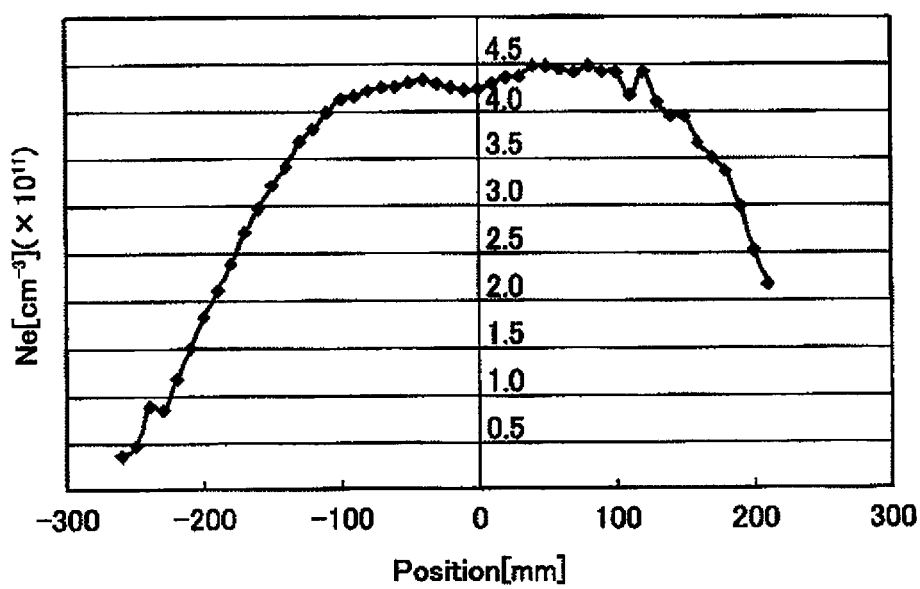
FIG. 18 is a graph showing an electric number distribution of the comparative example 3.
Figure 19:
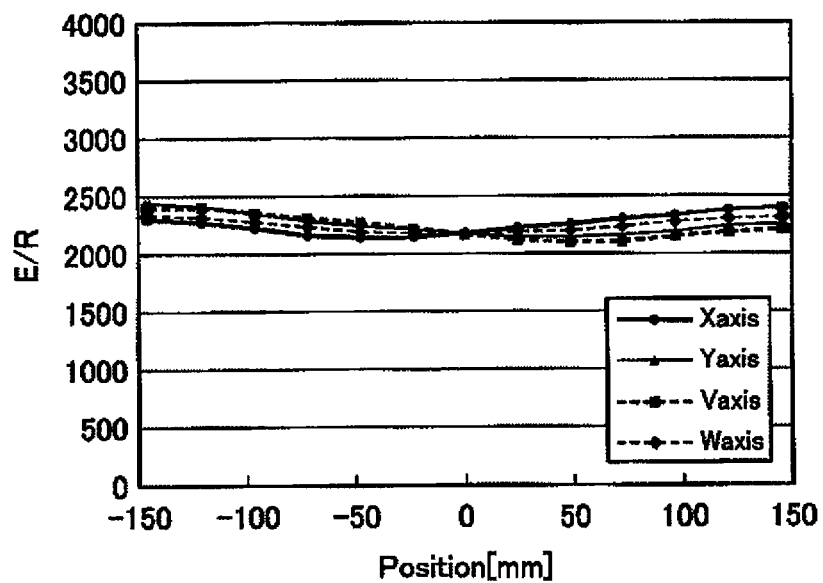
FIG. 19 is a graph showing an E/R distribution of the experimental example 1.

Further, in the comparative example 3, though the electron number Ne is uniform in inner side (±100 mm) of the groove 33a, a rapid decrease of the electron number Ne was observed outer side thereof (FIG. 18). Meanwhile, in the experimental example 1 and the comparative example 2, the electron number Ne is uniform up to an outer diameter position (±190 mm) of the grooves 16 and 32a. Accordingly, it is desirable to dispose the groove in more outer side of the dielectric.

Further, it was found that the electron number Ne in the central region is the greatest in the experimental example 1 (FIG. 15). To be more specific, the electron number Ne in the central region of the comparative example 2 is equivalent to about 60% of the experimental example 1 (FIGS. 15 and 17), and the electron number Ne in the central region of the comparative example 3 is equivalent to about 70% of the experimental example 1 (FIGS. 15 and 18). Accordingly, it is desirable to set the groove width of the groove to be equal to or greater than a certain value (equal to or greater than about 61 mm according to FIGS. 4 to 11).

Figure 20:
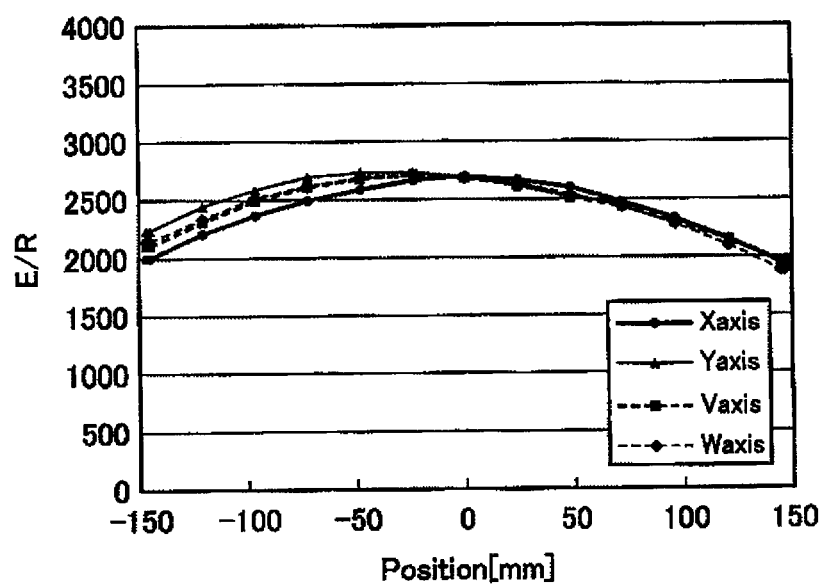
FIG. 20 is a graph showing an E/R distribution of the comparative example 1.
Figure 21:
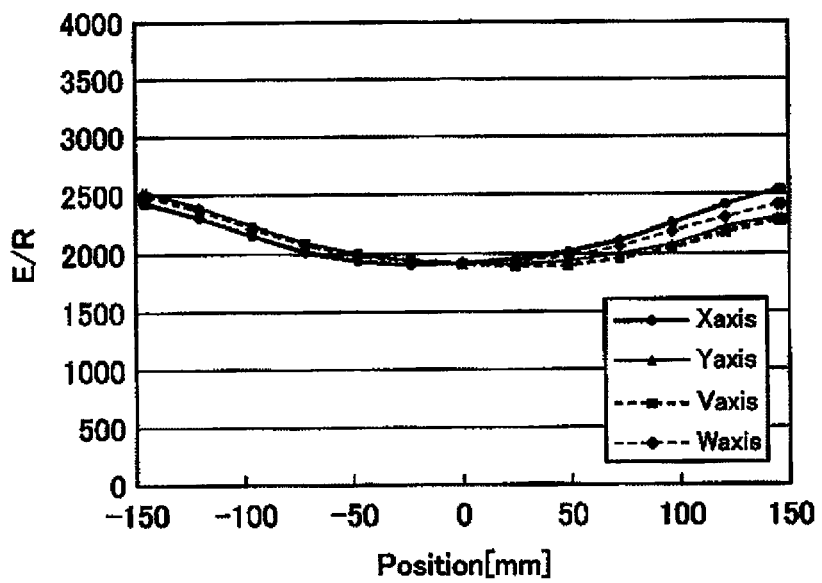
FIG. 21 is a graph showing an E/R distribution of the comparative example 2.
Figure 22:
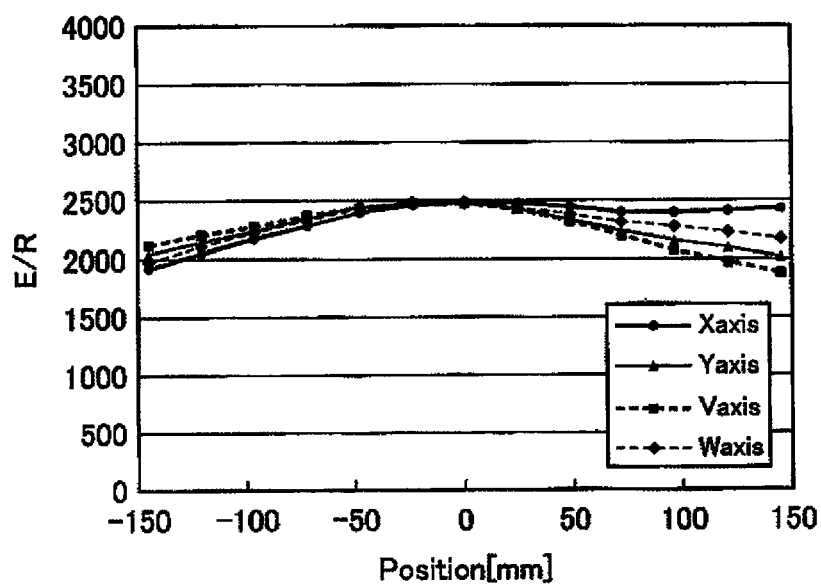
FIG. 22 is a graph showing an E/R distribution of the comparative example 3.

Now, referring to FIGS. 19 to 22, E/R was found to be most uniform in the experimental example 1 (FIG. 19), and most non-uniform in the comparative example 1 (FIG. 20). Further, it was also found that if the groove is disposed near central region (comparative examples 1 and 3), E/R in the central region tends to become higher than that in the edge region (FIGS. 20 and 22), while E/R tends to get higher in the edge region than in the central region (FIG. 21) if the groove is disposed near edge region (comparative example 2).

Figure 23:
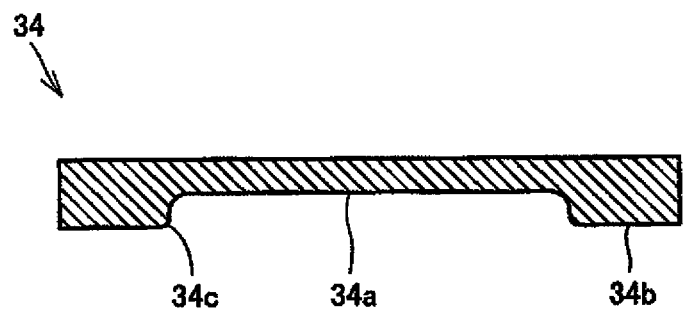
FIG. 23 is a cross sectional view of a dielectric of a comparative example 4.
Figure 24:
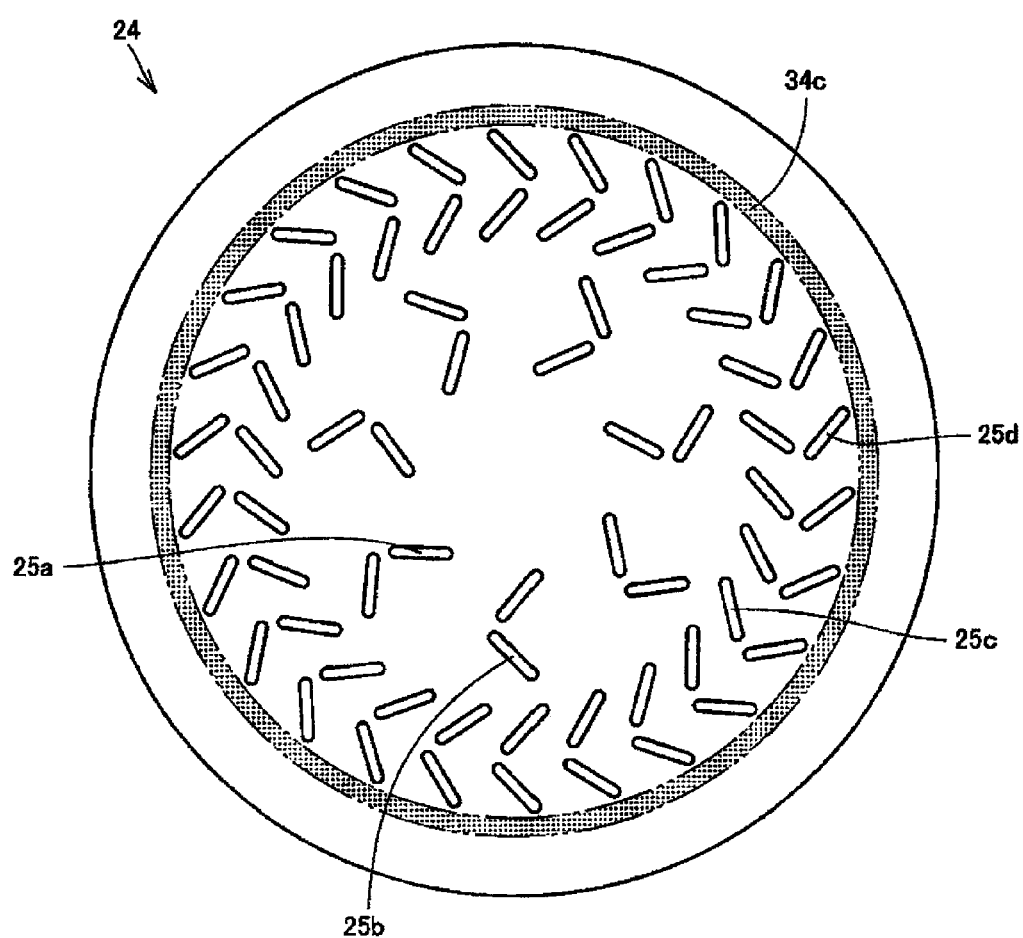
FIG. 24 is a plan view illustrating a slot antenna and the dielectric of the comparative example 4 overlapped with each other.

Subsequently, referring to FIGS. 3, 23 and 24 and Tables 1 and 2, the variation of plasma ignition property with respect to a positional relationship between the slots 25 and the inclined surfaces 16a and 16b will be explained. Further, FIG. 23 illustrates a dielectric 34 of a comparative example 4, and FIG. 24 presents a plan view showing the dielectric 34 and the slot antenna 24 overlapped with each other. Tables 1 and 2 show the plasma ignition property in case that the microwave output and the pressure in the processing space S are varied.

Referring to FIG. 23, as for the dielectric 34 of the comparative example 4, the thickness of a central region 34a on the bottom surface thereof is relatively thin, while the thickness of an edge region 34b is relatively thick. Further, provided between the central region 34a and the edge region 34b is an inclined portion 34c on which the thickness is successively varied. Referring to FIG. 24, all slots 25 are arranged on the inner side of the inclined portion 34c, i.e., in the flat central region 34a.

Table 1 shows results of observing the plasma ignition property of the experimental example 1 (FIGS. 2 and 3) by the combination of microwave outputs (500 W, 1000 W, 1500 W, 2000 W, 2200 W and 3000 W) and pressures in the processing space S (5 mT, 20 mT, 30 mT, 50 mT and 100 mT). Table 2 provides results of performing an experiment similar to the above-described experiment on the comparative example 4 (FIGS. 23 and 24). In the Tables, ○ implies a good plasma ignition property; Δ indicates that the plasma was ignited but it's not stable; x means that plasma was not ignited; and - implies that no experiment was conducted under the corresponding condition.

In the experimental example 1, the plasma ignition property was found to be good under all combinations of the microwave output and the pressure in the processing space S (Table 1). Meanwhile, in the comparative example 4, it was found that the overall plasma ignition property is low though it improves as the microwave output and the pressure in the processing space S increase (Table 2).

Accordingly, in the aspect of the plasma ignition property, it is desirable to form the slots 25 uprightly above the inclined surfaces, i.e., the inner and outer peripheral sidewall surfaces 16a and 16b. If the wavelength of the microwave becomes coincident with the thickness dimension of the dielectric plate at any one position of the inclined surfaces, the electric field intensity of the bottom surface of the dielectric improves. As a result, the plasma ignition property and stability can be improved. This is especially effective in case that the microwave output is small and the pressure in the processing space S is low.

TABLE 1

|  | 5 mT | 20 mT | 30 mT | 50 mT | 100 mT |
|---|---|---|---|---|---|
| 500 W | — | O | — | — | — |
| 1000 W | — | O | — | — | — |
| 1500 W | — | — | O | — | — |
| 2000 W | O | O | — | O | O |
| 2200 W | O | — | O | O | O |
| 3000 W | — | — | O | — | — |

TABLE 2

|  | 5 mT | 20 mT | 30 mT | 50 mT | 100 mT |
|---|---|---|---|---|---|
| 500 W | — | X | — | — | — |
| 1000 W | — | X | — | — | — |
| 1500 W | — | — | X | — | — |
| 2000 W | X | X | — | Δ | O |
| 2200 W | X | — | X | Δ | O |
| 3000 W | — | — | Δ | — | — |

Figure 25:
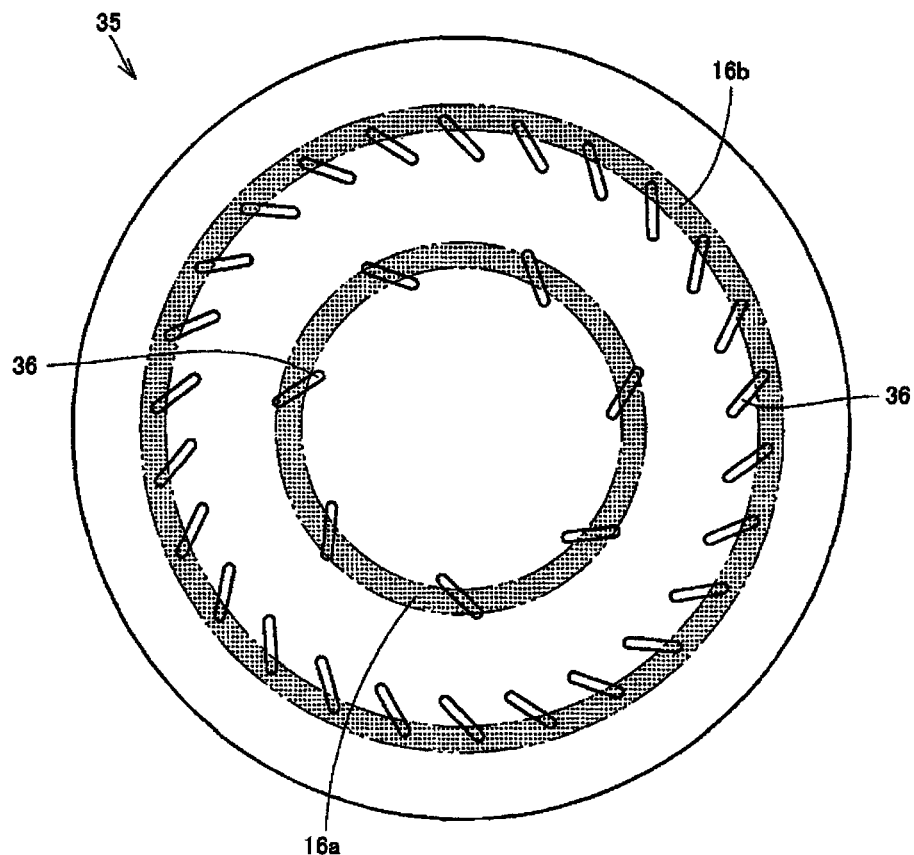
FIG. 25 is a plan view illustrating a slot antenna of a comparative example 5 and a dielectric overlapped with each other.

Now, referring to FIG. 3 and FIGS. 25 to 27, a relationship between the arrangement of slots 25 and E/R will be explained. FIG. 25 is a plan view showing a slot antenna 35 of a comparative example 5 and the dielectric 15 overlapped with each other, and FIGS. 26 and 27 show E/R distributions of the experimental example 1 and the comparative example 5.

Referring to FIG. 25, in the slot antenna 35 of the comparative example 5, the first slot group 25a and the third slot group 25c shown in FIG. 3 are omitted. That is, all slots 36 provided in the slot antenna 35 are located uprightly above either one of the inclined surfaces, i.e., the inner and outer peripheral sidewall surfaces 16a and 16b. Further, all the slots 36 are inclined in the same direction at the same angle relative to straight lines connecting the center of the slot antenna 35 with each slot 36 (such arrangement is referred to as a "parallel slot").

Figure 26:
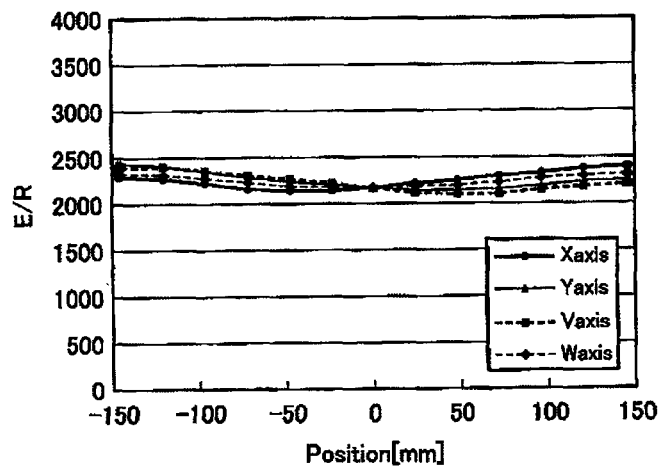
FIG. 26 is a graph showing an E/R distribution of the experimental example 1.
Figure 27:
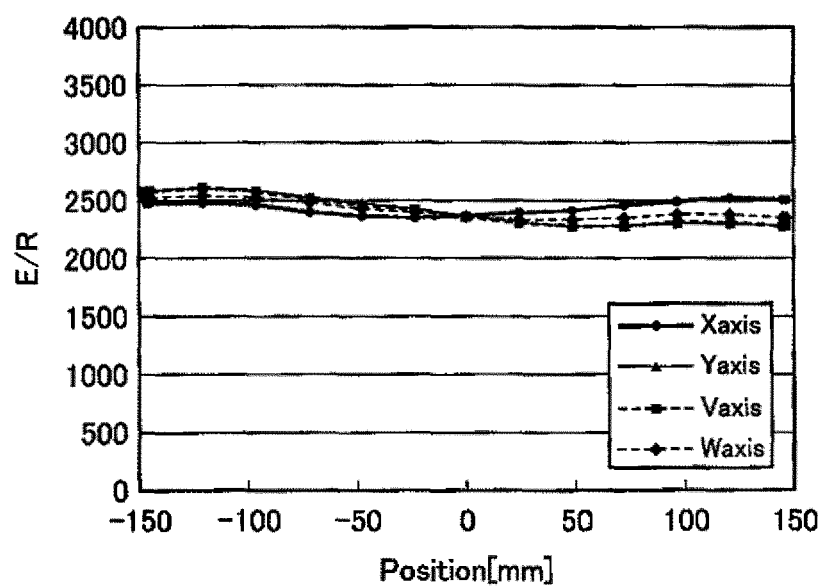
FIG. 27 is a graph showing an E/R distribution of the comparative example 5.

With reference to FIGS. 26 and 27, E/R was found to be slightly more uniform in the comparative example 5. Accordingly, in consideration of E/R uniformity, it is desirable to provide the slots only in regions uprightly above the inclined surfaces.

The above description of the present invention is provided for the purpose of illustration, and it would be understood by those skilled in the art that various changes and modifications may be made without changing technical conception and essential features of the present invention. Thus, it is clear that the above-described embodiments are illustrative in all aspects and do not limit the present invention.

The present disclosure is advantageous when used in a plasma processing apparatus.

The scope of the present invention is defined by the following claims rather than by the detailed description of the embodiment. It shall be understood that all modifications and embodiments conceived from the meaning and scope of the claims and their equivalents are included in the scope of the present invention.

What is claimed is:

1. A plasma processing apparatus comprising:
a processing chamber having a top opening;
a dielectric which has inclined surfaces on a bottom surface thereof so that a thickness dimension of the dielectric is successively varied, and is disposed so as to close the top opening of the processing chamber; and
an antenna disposed on a top surface of the dielectric, for supplying microwave to the dielectric, thereby generating plasma at the bottom surface of the dielectric,
wherein
a ring-shaped groove is formed in the bottom surface of the dielectric, and the inclined surfaces serve as an inner peripheral sidewall surface and an outer peripheral sidewall surface of the ring-shaped groove,
if a radius of the dielectric is R, the ring-shaped groove is located only outside a position corresponding to R/4 from a center of the dielectric,
the antenna is provided with a plurality of inner slot pairs and a plurality of outer slot pairs,
the outer slots of the inner slot pairs are positioned uprightly above the inner peripheral sidewall surface of the ring-shaped groove, and
outer slots of the outer slot pairs are positioned uprightly above the outer peripheral sidewall surface of the ring-shaped groove.

2. The plasma processing apparatus of claim 1, wherein the inclined surfaces are conic surfaces.

3. The plasma processing apparatus of claim 1, wherein the plurality of slots is inclined in a same direction at a same angle relative to straight lines connecting the center of the antenna with each slot.

4. A plasma processing apparatus comprising:
a processing chamber having a top opening;
a dielectric which has a ring-shaped groove on a bottom surface thereof, and is disposed so as to close the top opening of the processing chamber; and
an antenna for supplying microwave to the dielectric, thereby generating plasma at the bottom surface of the dielectric,
wherein an inner peripheral sidewall surface and an outer peripheral sidewall surface of the ring-shaped groove are inclined surfaces which are inclined so that a thickness dimension of the dielectric is successively varied,
the antenna is provided with a plurality of slots penetrating in a thickness direction thereof,
the plurality of slots is positioned uprightly above the inclined surfaces, such that a wavelength of the microwave is coincident with the thickness dimension of the dielectric at a position of the inclined surfaces, and
if velocity of light, frequency of the microwave and dielectric constant of a material constituting the dielectric are c, f and $\varepsilon r$, respectively, a groove width w of the ring-shaped groove satisfies Equation 1 as follows:

$$\frac{c}{f\sqrt{\varepsilon r}} \times 0.5 \leq w \leq \frac{c}{f\sqrt{\varepsilon r}} \times 1.5, \quad \text{[Equation 1]}$$

and
wherein if a radius of the dielectric is R, the ring-shaped groove is located only outside a position corresponding to R/4 from a center of the dielectric,
the plurality of slots includes a plurality of inner slot pairs and a plurality of outer slot pairs, outer slots of the inner slot pairs are positioned uprightly above the inner peripheral sidewall surface of the ring-shaped groove, and outer slots of the outer slot pairs are positioned uprightly above the outer peripheral sidewall surface of the ring-shaped groove.

5. The plasma processing apparatus of claim 4, wherein if the frequency of the microwave supplied from the antenna is $f=2.45 \times 10^9$(Hz) and the material constituting the dielectric is quartz having a dielectric constant of $\in r=3.8$, the ring-shaped groove width w of the groove satisfies 33 mm≤w≤93 mm.

6. The plasma processing apparatus of claim 4, wherein the plurality of slots is inclined in a same direction at a same angle relative to straight lines connecting the center of the antenna with each slot.

* * * * *